United States Patent
Chang et al.

(10) Patent No.: US 10,620,879 B2
(45) Date of Patent: Apr. 14, 2020

(54) WRITE-WHILE-READ ACCESS METHOD FOR A MEMORY DEVICE

(71) Applicant: MACRONIX INTERNATIONAL CO., LTD., Hsinchu (TW)

(72) Inventors: Kuen-Long Chang, Taipei (TW); Ken-Hui Chen, Hsinchu (TW); Su-Chueh Lo, Hsinchu (TW); Shang-Chi Yang, Changhua (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/890,595

(22) Filed: Feb. 7, 2018

(65) Prior Publication Data
US 2018/0335980 A1 Nov. 22, 2018

Related U.S. Application Data

(60) Provisional application No. 62/507,243, filed on May 17, 2017.

(51) Int. Cl.
*G06F 3/06* (2006.01)
*G06F 12/02* (2006.01)
(Continued)

(52) U.S. Cl.
CPC .......... *G06F 3/0659* (2013.01); *G06F 3/0613* (2013.01); *G06F 3/0644* (2013.01);
(Continued)

(58) Field of Classification Search
CPC .... G06F 3/0613; G06F 3/0644; G06F 3/0659; G06F 3/0679; G06F 12/1009; G06F 3/06; G06F 12/06; G06F 9/30
(Continued)

(56) References Cited

U.S. PATENT DOCUMENTS 6,275,931 B1  8/2001  Narayanaswamy et al.
6,282,675 B1  8/2001  Sun et al.
(Continued)

FOREIGN PATENT DOCUMENTS

EP  0483525 A2 * 5/1992 ............ G06F 12/08
TW  201011647 A  3/2010
(Continued)

OTHER PUBLICATIONS

US Notice of Allowance in U.S. Appl. No. 15/868,896 dated Jun. 18, 2019, 26 pages.

*Primary Examiner* — Pierre Miche Bataille
(74) *Attorney, Agent, or Firm* — Haynes Beffel & Wolfeld LLP

(57) ABSTRACT

A memory device includes a memory including first and second pages in first and second banks, respectively, an address decoder mapping command addresses to physical addresses. The memory device further includes circuitry configured to maintain a status indicating a most recently written page, decode received command sequences including command addresses and implementing an operation including (i) responsive to receiving a command sequence including a read command address that is pre-configured for reading data, causing the address decoder to map the read command address to one of the first and second pages selected according to the status, and (ii) responsive to receiving a second command sequence including a write command address that is pre-configured for writing data, causing the address decoder to map the write command address to one of the first and second pages selected according to the status.

20 Claims, 6 Drawing Sheets

(51) Int. Cl.
  *G06F 12/00* (2006.01)
  *G11C 16/10* (2006.01)
  *G11C 7/10* (2006.01)
  *G11C 16/26* (2006.01)
(52) U.S. Cl.
  CPC ............ *G06F 3/0679* (2013.01); *G06F 12/00* (2013.01); *G06F 12/0246* (2013.01); *G11C 7/1042* (2013.01); *G11C 16/10* (2013.01); *G11C 16/26* (2013.01); *G06F 2212/1024* (2013.01); *G06F 2212/7201* (2013.01); *G06F 2212/7203* (2013.01); *G11C 2207/2209* (2013.01)
(58) Field of Classification Search
  USPC ........................................................ 711/103
  See application file for complete search history.

(56) References Cited

U.S. PATENT DOCUMENTS

| | | | |
|---|---|---|---|
| 6,401,221 B1 | 6/2002 | Sun et al. | |
| 6,453,370 B1 * | 9/2002 | Stracovsky | G06F 12/0215 710/17 |
| 6,651,188 B2 | 11/2003 | Harding et al. | |
| 6,748,480 B2 | 6/2004 | Chudnovsky et al. | |
| 7,017,004 B1 | 3/2006 | Calligaro et al. | |
| 7,237,145 B2 | 6/2007 | Sun et al. | |
| 8,341,386 B2 | 12/2012 | Lee | |
| 8,504,796 B2 | 8/2013 | Iyer et al. | |
| 8,880,862 B2 | 11/2014 | Fallon et al. | |
| 9,158,683 B2 | 10/2015 | Kokrady et al. | |
| 9,514,038 B2 | 12/2016 | Okin et al. | |
| 2003/0117877 A1 * | 6/2003 | Roohparvar | G11C 16/10 365/230.03 |
| 2003/0229752 A1 | 12/2003 | Venkiteswaran | |
| 2008/0034234 A1 * | 2/2008 | Shimizu | G06F 1/3225 713/320 |
| 2008/0141016 A1 | 6/2008 | Chang et al. | |
| 2014/0089561 A1 | 3/2014 | Pangal et al. | |
| 2015/0170729 A1 * | 6/2015 | Schaefer | G11C 8/12 365/230.02 |
| 2016/0276002 A1 | 9/2016 | Lee | |
| 2017/0076789 A1 * | 3/2017 | Oh | G11C 7/1021 |
| 2018/0342286 A1 * | 11/2018 | Richter | G11C 11/40618 |

FOREIGN PATENT DOCUMENTS

| | | | |
|---|---|---|---|
| TW | 201319942 A | 5/2013 | |
| TW | 201502991 A | 1/2015 | |
| TW | 201710888 A | 3/2017 | |
| WO | 0007106 A1 | 2/2000 | |
| WO | WO-2006036798 A2 * | 4/2006 | ........ G06F 13/1631 |

* cited by examiner

400

| COMMAND ADDRESS | PHYSICAL ADDRESS | STATUS |
|---|---|---|
| Read Command Address | PAGE A | Most Recently Written |
| | PAGE B | Not Most Recently Writen |
| Write Command Address | PAGE A | Most Recently Written |
| | PAGE B | Not Most Recently Writen |

410

| COMMAND ADDRESS | PHYSICAL ADDRESS | STATUS |
|---|---|---|
| Read Command Address | PAGE A | Not Most Recently Written |
| | PAGE B | Most Recently Written |
| Write Command Address | PAGE A | Not Most Recently Written |
| | PAGE B | Most Recently Written |

FIG. 4

WRITE-WHILE-READ ACCESS METHOD FOR A MEMORY DEVICE

PRIORITY APPLICATION

This application claims the benefit of U.S. Provisional Patent Application No. 62/507,243 filed 17 May 2017; which application is incorporated herein by reference.

FIELD

The present technology relates to a memory device having a memory such as NOR flash memory and embedded logic that, responsive to command sequences, reads and writes data to the memory.

DESCRIPTION OF RELATED ART

Data processing systems are sometimes characterized as including a host system and a memory system. The host system usually operates with logical addresses that provide a layer of abstraction between the host system software and physical memory in the memory system. The memory system can include a controller that performs logical to physical address translations to translate the host level read and write requests based on the logical addresses into a command structure including physical or command addresses used by the memory device.

One type of memory that can be used in a memory system is a NOR flash memory, which is often used to store code because of its superior random access capability, as compared to a NAND flash memory. Reading (sequential) code requires that it be delivered in a proper sequence, so as to preserve the functionality of the code. When the code (or part of it) stored on the NOR flash memory, for example, must be changed, then the possibility that it is being executed at the time must be addressed.

If the stored code is being executed at the same time a request is received to change the code, then the read operation for reading the code needs to continue to some safe stopping place before it is replaced with new code, so as not to cause an error in the execution of the code. The same is true for a write operation. The writing of the code must be safely completed or continue to some safe stopping place before the code can be reliably read.

In conventional systems, the memory may be configured so that code, such as boot code for example, is maintained at specified or default blocks in the memory. Using such a structure, a read of the boot code requires access to the specified block, and use of the physical address dedicated for that specified block. A write of the boot code requires access to the same specified block.

Executing a read command to read a page of data, for example, can require many clock cycles after the read command, as the data is delivered one byte (or whatever unit) at a time to a memory interface. Likewise, executing a write command will require many clock cycles after the write command, as the data to be written are loaded onto the memory. This is programming operations (i.e., ease and write operations) are relatively slow, meaning that they require many clock cycles. This structure creates a bottleneck as the second one of the commands (the read command or the write command) must wait until the first one of the commands (the other of the read command or the write command) has safely completed before execution.

In the scenario described above, the read operation is delivering sequential code at the time that the write command is issued. Conventional memory systems can handle this situation by executing the write on a different bank (i.e., to a new address) and after writing the code to the different bank, moving the sequential code to the specified or default bank, or perhaps instead of moving the sequential code the specified or default bank, communicating the new address of the different bank up the logical layers to be used for the next read of the sequential code. The moving of the sequential code after being written to the different bank, would present a second possibility of conflict, and is not a robust solution. Likewise, changing the default address for the sequential code to the new address can complicate system operation. Because of these complications, neither of these solutions is built into the architecture of conventional memory.

Alternatively, the write operation can wait until a safe stopping place in the read operation (e.g., the end of a page read) and then overwrite the page. However, this would require a time consuming erase operation and then the write (programming) operation.

The technology disclosed provides a memory architecture that solves these problems.

SUMMARY

The present technology provides a memory device that is capable of performing a write-while-read operation that can, when a write operation is initiated, suspend and resume a reading operation without the need to completely restart the reading operation.

In one aspect of the present technology, a memory device is provided. The memory device described herein includes a memory, control circuitry and an address decoder. The memory is configured with pages, the pages including a first set of pages including a first page in a first bank and a second page in a second bank. The address decoder maps received command addresses to physical addresses of pages and banks of the memory. The control circuitry is configured to maintain a status indicating a most recently written page of the first set of pages, to decode received command sequences that comprise the command addresses, to execute operations identified in the command sequences, and to implement an operation. The operation includes (i) responsive to receiving a first command sequence including a read command address that is pre-configured for reading data from the first set of pages, causing the address decoder to map the read command address to one of the first page in the first bank and the second page in the second bank selected in response to the status, and responsive to receiving a second command sequence including a write command address that is pre-configured for writing to the first set of pages, causing the address decoder to map the write command address to one of the first page in the first bank and the second page in the second bank selected in response to the status.

In another aspect of the present technology, a method of operating a memory device is provided. The method includes configuring a first set of pages of the memory to include a first page in a first bank and a second page in a second bank, mapping received command addresses to physical addresses of the pages and the banks of the memory, maintaining a status indicating a most recently written page of the first set of pages, decoding received command sequences that comprise the command addresses, executing operations identified in the command sequences, and implementing an operation including: (i) responsive to receiving a first command sequence including a read command address that is pre-configured for reading data from the first set of pages, mapping the read command address to one of the first page in the first bank and the second page in the second bank selected in response to the status; and (ii) responsive to receiving a second command sequence including a write command address that is pre-configured for writing to the first set of pages, mapping the write command address to one of the first page in the first bank and the second page in the second bank selected in response to the status.

In another aspect of the present technology, a method of manufacturing a memory device is provided. The method includes providing a memory configured with pages, the pages including a first set of pages including a first page in a first bank and a second page in a second bank, providing and configuring an address decoder to map received command addresses to physical addresses of pages and banks of the memory; and providing control circuitry configured to maintain a status indicating a most recently written page of the first set of pages, to decode received command sequences that comprise the command addresses, to execute operations identified in the command sequences, and to implement an operation. The operation includes: (i) responsive to receiving a first command sequence including a read command address that is pre-configured for reading data from the first set of pages, causing the address decoder to map the read command address to one of the first page in the first bank and the second page in the second bank selected in response to the status; and (ii) responsive to receiving a second command sequence including a write command address that is pre-configured for writing to the first set of pages, causing the address decoder to map the write command address to one of the first page in the first bank and the second page in the second bank selected in response to the status.

Other aspects and advantages of the present technology can be seen on review of the drawings, the detailed description and the claims, which follow.

BRIEF DESCRIPTION OF THE DRAWINGS

FIG. 4 illustrates example mapping logic of mapping a command address to a physical address to a particular page of a set of pages of a memory.

DETAILED DESCRIPTION

A detailed description of embodiments of the present technology is provided with reference to the FIGS. 1-6.

The problems described in the background section of this disclosure can be solved by providing a memory architecture that can configure, for example, a boot block (or other blocks) to include sets of two or more banks and pages to prevent address conflicts and prevent the need to move written data and prevent the need to update read addresses for accessing the code.

Specifically, the technology disclosed can overcome these problems by providing a memory device that (i) configures a memory with a set of pages that includes first and second pages in first and second banks, respectively, (ii) maps received command addresses to physical addresses of the pages and banks of the memory, and (iii) maintains a status indicating a most recently written page of the set of pages. This structure can allow the memory device to map a read command address that is pre-configured for reading data from the set of pages to one of the first page in the first bank and the second page in the second bank, selected in response to the status and to map a write command address that is pre-configured for writing data from the set of pages in one of the first page in the first bank and the second page in the second bank, selected in response to the status.

Figure 1:
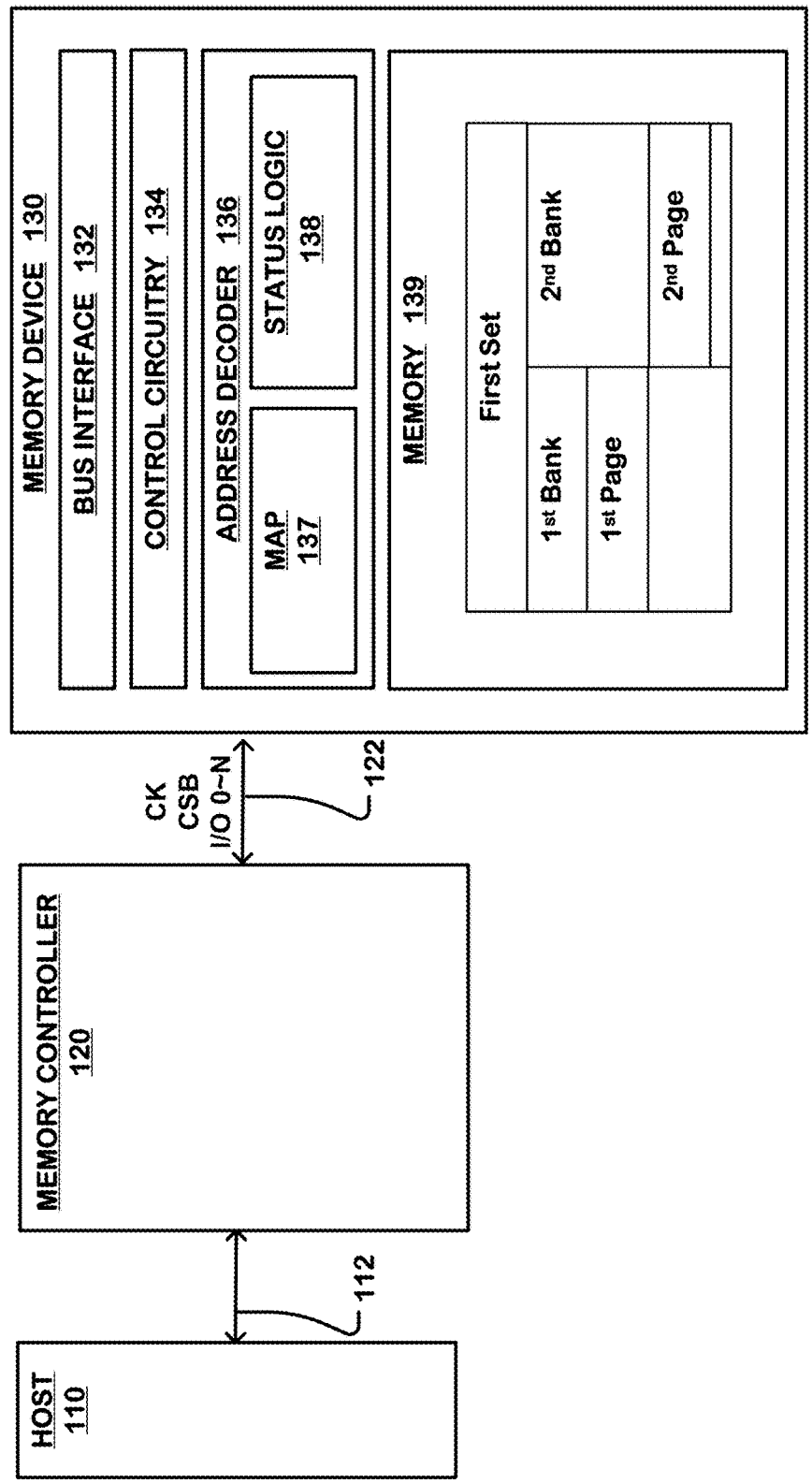
FIG. 1 illustrates a functional block diagram of a system including a host, a memory controller and a memory device configured to perform a write-while-read operation.

FIG. 1 illustrates a functional block diagram of a system including a host, a memory controller and a memory device configured to perform a write-while-read operation. Specifically, FIG. 1 illustrates a simplified functional block diagram of a system 100, which comprises a host 110, a communication bus 112, a memory controller 120, a communication bus 122 and a memory device 130. In system 100 the host 110 executes programs that read and write data using logical addresses. The host 110 communicates across the communication bus 112 to the memory controller 120 and the memory controller 120 communicates across the communication bus 122 to the memory device 130.

The host 110, for example, can be a computer system running an operating system that delivers requests (e.g., write and read) to the memory controller 120 through the communication bus 112.

The communication bus 112 between the host 110 and the memory controller 120 can be, for example, a peripheral component interconnect (PCI) bus, peripheral component interconnect express (PCIe) bus, serial ATA (SATA), and any other type of bus that communicates using appropriate communication protocols.

The memory controller 120 can be implemented using software or other logic structures in a microcontroller unit (MCU) or a dedicated memory controller chip. In other embodiments the host 110 and memory controller 120 can be implemented on a single processor, or the host 110 and memory controller 120 can comprise parts of a complex data processing system. The memory controller 120 can acts as an interface between the host 110 and the memory device 130. One function of the memory controller 120 is to translate higher-level read and write requests into the command language of the particular memory device 130 that can be used to access physical memory 139 included on the memory device 130. The memory controller 120 may include an interface layer (not illustrated) that is responsible for composing command sequences for performing read and write operations to and from the memory device 130, in a manner that is compatible with the memory device 130 and the physical memory 139. The command sequences can be composed by translating logical addresses received from the host 110 into physical addresses for the memory device 130.

The memory controller 120 is connected to the memory device 130 by the communication bus 122. For the purpose of this description, the communication bus 122 can be a communication system that transfers data between nodes of the memory controller 120 and the memory device 130. The communication bus 122 can include bus lines (e.g., physical layer connections like wires, optical fiber, wireless links, etc.), connected to the memory controller 120 and the memory device 130.

For example, the memory controller 120 can use a bus structure having a plurality of bus lines I/O 0~N, along with a chip select line (CSB) (active low or active high) and a clock line (CK). The communication bus 122 can comprise a serial peripheral interface (SPI) bus or other synchronous serial communication interface characterized by a synchronous clock line, a chip select line and one or more data lines synchronized with a synchronous clock on the synchronous clock line. SPI devices typically use a four-wire synchronous serial communication protocol, which can communicate in full duplex mode (CK, CSB, master in/slave out (MISO), master out/slave in (MOST)).

The memory device 130 includes a bus interface 132, control circuitry 134, an address decoder 136, and physical memory 139. The physical memory 139 of the memory device can be a single-bit-per-cell or multiple-bit-per-cell NOR non-volatile flash memory device or a set of devices such as solid state drive memory technologies. In other examples, the physical memory 139 can comprise other types of non-volatile memory devices, including single-bit-per-cell or multiple-bit-per-cell NAND flash, phase change memory, magnetic memory, metal oxide programmable resistance memory and so on.

Further, portions of the physical memory 139 are configured with sets of pages on which read and write operations are performed. For example, as illustrated in FIG. 1, the pages can include a first set of pages that include a first page in a first bank of the physical memory 139 and a second page in a second bank of the physical memory 139. Additionally, the first set of pages could include additional pages from the same or different banks (not illustrated). The pages of the memory 139 can include a second set of pages that include a third page in a third bank of the physical memory 139 and a fourth page in a fourth bank of the physical memory 139 (not illustrated). Alternatively, the third and fourth pages, of the second set of pages, can be respectively located in the first and second banks of the physical memory 139. At least one of the pages of each set of pages must in a separate bank than the other page or pages of the set. These sets of pages can be configured or designated by logic on the memory device 130, such as a map or control circuitry.

The address decoder 136 of the memory device 130 includes a map 137 and status logic 138. The map 137 maps command addresses (e.g., read command addresses and write command addresses) received on the bus interface 132 from the memory controller 120 to physical addresses of the pages and banks of the physical memory 139. The status logic 138 is used to indicate to the map 137 which page of a set of pages is to be read from and written to. In an implementation the map 137 can act as a multiplexer that responds to a status bit output by the status logic 138 to determine which page of a set of pages is to be read from and which page of a set of pages is to be written to. The status logic 138 does not need to be located on the address decoder 136 and can be located somewhere else on the memory device 130. This illustration of the memory device 130 is only for the purpose of showing the different elements of and functions performed by the memory device 130.

The control circuitry 134 accesses the physical memory 139, executes memory read and write operations and maintains a status that indicates a most recently written page of each of the sets of pages (i.e., the first set of pages) of the physical memory 139. This status, which indicates the most recently written page, is what allows the map 137, by way of the status logic 138, to determine (map) which page of the set of pages should be written to, and allows the map 137, by way of the status logic 138, to determine (map) which page of the set of pages should be read from.

The control circuitry 134 also decodes the command sequences received on the bus interface 132 from the memory controller 120. These command sequences can include corresponding operation codes, such as read, write, erase, etc., the command addresses and/or data, such as the data to be written to the physical memory 139. The control circuitry 134 executes operations that are identified in the received command sequences and also implements, at least in part, the write-while-read operation.

For example, the write-while-read operation is performed when the control circuitry 134 receives a first command sequence that includes a read command to read data (e.g., data X) and a read command address (that is pre-configured for reading data from the first set of pages) and then receives (before the read operation is complete) a second command sequence that includes a write command to write/update the data (e.g., to update data X) and a write command address (that is pre-configured for writing data to the first set of pages). The pre-configured read and write addresses can be set up using logic on the memory device 130. For example, the read command address that is pre-configured for reading data from a particular set of pages (e.g., the first set of pages) is designated by the map 137 of the memory device 130 for reading the data. Similarly, the write command address that is pre-configured for writing data to the particular set of pages (e.g., the first set of pages) is also designated by the map 137 of the memory device 130. Alternatively, the memory controller 120 can be configured to assign (pre-configure) the read command addresses and the write command addresses to certain operations based, in part, on logic contained thereon and/or based on a configuration or logic of the operating system of the host 110.

This write-while-read operation can be performed because the read command address received from the memory controller 120 is mapped by the address decoder 136 to, for example, the first page of the first bank of the memory 139 and the (pre-configured) write command address received from the memory controller 120 is mapped by the address decoder 136 to, for example, the second page of the second bank of the memory 139. For example, a read operation of reading data X from the first page of the first bank of the physical memory 139 can be paused/suspended while the write command proceeds to write updated data X to the second page of the second bank of the physical memory 139. Once the writing operation is partially complete (e.g., at a point where the read operation can resume) or is fully complete, the read operation of reading data X from the first page of the first bank of the physical memory 139 can resume from where it left off, without needing to restart from the beginning. After the writing is complete, the updated data X is stored the second page of the second bank of the physical memory 139.

This write-while-read operation requires the data to be read/written from/to different banks of the physical memory 139. Without the reading and the writing being directed to different banks of the physical memory 139, the reading would have to start from the beginning because, for example, the write operation would erase the entire bank of the physical memory 139. This write-while-read operation also requires, after the reading of data X is complete, the memory device 130 to update the status that indicates the most recently written page of the set of pages. This will cause the read command address to be mapped to the page/bank that contains the updated data X and cause the write command to be mapped to the page/bank that was previously read from. In other words, the combination of the address decoder 136 and the status allows the control circuitry 134 to implement the operation that switches the pages/banks that are mapped to the read command addresses and the write command addresses. In this example, after the mapping is updated the read command will be mapped to the second page of the second bank of the physical memory 139 and the write command will be mapped to the first page of the first bank of the physical memory 139. The map 137 and the status logic 138 of the address decoder 136 in combination with the control circuitry 134 are able to manage the mapping for more than just one set of pages.

Figure 2:
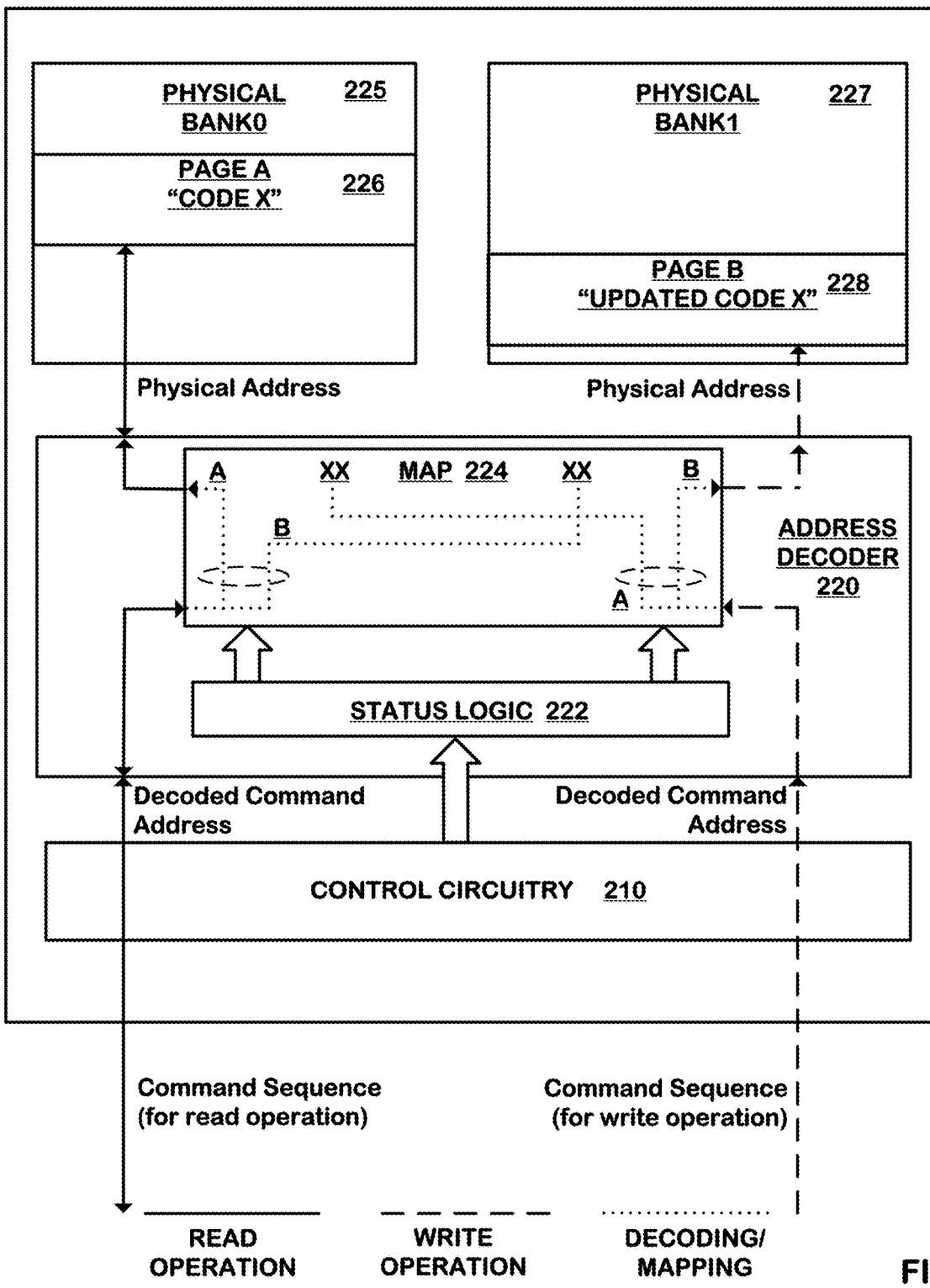
FIG. 2 illustrates a functional block diagram of a memory device that performs a write-while-read operation.

FIG. 2 illustrates a functional block diagram of a memory device that performs a write-while-read operation. Specifically, FIG. 2 illustrates a memory device 200 that includes control circuitry 210, an address decoder 220 having status logic 222 and a map 224, and physical memory. The physical memory can include a physical bank0 225 including page A 226 and a physical bank1 227 including page B 228. The operation of the memory device 200 of FIG. 2 is similar to that of the memory device 130 system 100 of FIG. 1. Therefore, some redundant descriptions thereof are omitted.

The address decoder 220 of the memory device 200 performs the mapping between the read/write command addresses and the physical addresses of the memory based on the status logic 222. Further, as illustrated by FIG. 2, command sequences for performing read and write operations are received from a memory controller (not illustrated). A representative path for the read operation is represented by a solid line, a representative path for the write operation is represented by a dashed line and representative paths for the mapping performed by the map 224 of the address decoder 220 are represented by dotted lines.

As mentioned above, the physical memory of the memory device 200 can include a physical bank0 225 that includes physical page A 226 and include physical bank1 227 that includes physical page B 228. Physical page A 226 and physical page B 228 can be a set of pages. Unlike the logical addresses that are referenced by a host (not illustrated) or by software running on the host, these banks and pages are physical banks located on the memory of the memory device 200 and they have physical addresses.

The control circuitry 210 of the memory device 200 can decode the received command sequences that include operation codes, such as read, write, erase, etc., command addresses, data, as well as other information, as received from a memory controller. Specifically, the received command sequences can include a read command address that is pre-configured by the map 224 of the address decoder 220 for reading data from a specific set of pages of the physical memory and can include a write command address that is pre-configured by the map 224 of the address decoder 220 for writing data to the specific set of pages of the physical memory. The decoded commands and command addresses are received by the address decoder 220. The control circuitry 210 can also maintain a status of which page of the set of pages of the physical memory has been most recently written to. The map 224 of the address decoder 220 can map (dotted lines) the (pre-configured) read command address to the appropriate page of the set of pages of the memory device 200. The map 224 can also map the (pre-configured) write command address to the appropriate page of the set of pages of the memory device 200.

Specifically, the map 224 and the status logic 222 of the address decoder 220 can be implemented to map the (pre-configured) read command address to the appropriate page of the set of pages (e.g., page A 226 and page B 228). The map 224 and the status logic 222 can also be implemented to map the (pre-configured) write command address to the appropriate page of the set of pages (e.g., page A 226 and page B 228). The map 224 of the address decoder 220 can be a simple table or something more complex. Further, the map 224 can be implemented so that it only maps addresses that are pre-configured for reading/writing to/from the sets of pages that are for implementing a write-while-read operation. The status logic 222 indicates to the map 224 which physical address (e.g., which of two different physical address) should be selected for a read operation and which physical address should be selected for a write operation. This indication by the status logic 222 to the map 224 is based on the status that is maintained by the control circuitry 210 and indicates which of the pages of the set of pages has been most recently written to.

In the implementation illustrated in FIG. 2, the map 224 of the address decoder 220 provides a translation (mapping) between (i) the read command address that is pre-configured for reading data from a set of pages of the physical memory (the read command address is included in the command sequence received from the memory controller) and (ii) physical addresses of page A 226 of physical bank0 225 and page B 228 of physical bank1 227. Similarly, the map 224 of the address decoder 220 provides a translation (mapping) between (i) the write command addresses that is pre-configured for writing data to a set of pages of the physical memory (the write command address is included in the command sequence received from the memory controller) and (ii) physical addresses of page A 226 of physical bank0 225 and page B 228 of physical bank1 227.

As mentioned above, page A 226 and page B 228 are configured as a set of pages (from different banks). In this implementation, the map 224 of the address decoder 220 is capable of mapping the (pre-configured) read command address to both pages (i.e., page A 226 and page B 228) of the set of pages, and is capable of mapping the (pre-configured) write command address to both pages of the set of pages. The dotted lines in the map 224 illustrate that the map 224 is capable of mapping the (pre-configured) read command address, as well as the (pre-configured) write command address to both of page A 226 and page B 228. The status logic 222 of the address decoder 220 is able to, based on the status of the pages of the set of pages, control which page of the set of pages should be read from and which page of the set of pages is to be written to based on the status that is maintained by, for example, the control circuitry 210 of the address decoder 220. In an implementation, the status logic 222 can act as a register (a status register, a flag register, a condition register, etc.) that toggles a bit based on which page of the set of pages has been most recently written to. The bit can be toggled by the control circuitry 210 that maintains the status or the bit can be toggled by some other mechanism. Note that the status logic 222 can perform this same function for more than just one set of pages. Based on the status provided by the status logic 222, the map 224 can act as a switch that has an input for the (pre-configured) read command address and can select one of the physical address of page A 226 and the physical address of page B 228. The same concept is applied to the (pre-configured) write command address.

For example, if the status indicates that page A 226 was the most recently written page of the set of pages, then the status provided by the status logic 222 would select (or cause the map 224 to select) page A 226 (see path "A" which leads to page A 226) for performing a read operation. Alternatively, if the status indicates that page B 228 was the most recently written page of the set of pages, then the status logic 222 would select (or cause the map 224 to select) page B 228 (see path "B" which leads to page B 228) for performing the read operation. The same concept applies to writing operations. For example, if the status indicates that page A 226 was the most recently written page of the set of pages, then the status provided by the status logic 222 would select (or cause the map 224 to select) page B 226 (see path "B" which leads to page B 226) for performing a write operation. Alternatively, if the status indicates that page B 228 was the most recently written page of the set of pages, then the status logic 222 would select (or cause the map 224 to select) page A 228 (see path "A" which leads to page A 228) for performing the write operation.

Additionally, the control circuitry 210 can also keep the address decoder 220 updated so that the correct pages of the sets of pages (e.g., page A 226 and page B 228) are identified for read and write operations. For example, the control circuitry 210 can update the map 224 to add or change which command addresses are pre-configured for reading data and writing data and to add or change which pages of the set of pages of the memory are actually mapped to the pre-configured command addresses.

When the read operation is mapped to, for example, page A 226, the read operation will proceed to read the data from page A 226 back through the memory controller and eventually to the host and the software running on the host. Various timing, buffering and caching mechanisms (not illustrated) are typically implemented to assist in the transmission of the read request to the memory device 200 and the transmission of the read data from the memory device 200, through the controller, and ultimately to the host (operating system). Those skilled in the art will understand the various timing, buffering and caching mechanisms necessary to complete this read operation.

Referring to FIG. 2, an example of a read operation that reads "code x" from the page A 226 of the memory device 200 and an example of a write operation that writes "updated code x" to page B 228 of the memory device 200 are provided. Specifically, FIG. 2 illustrates that a command sequence to read "code x" has been received from the host/controller, and that a command sequence to update "code x" has been received from the host/controller before the reading of "code x" has completed. As described in the background section of this application, many conventional memory systems would be forced to stop the read operation, allow the write operation to start and then finish, and then restart the read operation from the beginning. However, because of the unique structure provided by this write-while-read technology the write operation that updates "code x" can be performed without the need to stop and then restart the operation of reading "code x." This can be achieved because the (pre-configured) read command address is mapped by the address decoder 220 to a different page in a different physical bank than the (pre-configured) write command address. Accordingly, the "new" or "updated" version of code x can be written without necessitating a stop and then restart of the reading of the "old" or "original" version of "code x." After a portion of the writing operation is complete or after the entire writing operation is complete, the suspended reading operation can resume from exactly where it left off.

In a different implementation, the memory device 200 can support parallel or simultaneous data transfer using dedicated busses. This would allow the read operation to continue without interruption (e.g., without suspending and then resuming the read operation) while the write operation is performed.

As illustrated in FIG. 2, this write-while-read operation can be performed because the control circuitry 210 maintains the status indicating a most recently written page of the set of pages (e.g., page A 226 and page B 228). During the operation illustrated in FIG. 2 (and before the completion of the writing operation to write the updated code x to page B 228), the status indicates that page A 226 was the most recently written page of the set of pages. Accordingly, the status logic 222, based on the status maintained by the control circuitry 210, causes the map 224 to map the (pre-configured) read command address to page A 226 (see path A of the read operation, and see where the potential path for reading from page B 228 is not selected (the path is "XX"ed out)). Further, based on the status maintained by the control circuitry 210, the status logic 222 causes the map 224 to map the subsequent (pre-configured) write command address to page B 228 (see path B of the write operation, and see where the potential path for writing to page A 226 is not selected (the path is "XX"ed out)). As a result, the control circuitry 210, upon receiving a first command sequence that includes the read command and the (pre-configured) read command address to read the data (i.e., code x) from the set of pages, the address decoder 220 is caused to map the (pre-configured) read command address to page A 226. This is accomplished because the status logic 222 causes the map 224 to select path A based on the status maintained by the control circuitry 210 of the memory device 200.

Furthermore, the control circuitry 210, upon receiving a second command sequence that includes the write command and the (pre-configured) write command address to write the data (i.e., updated code x) to the set of pages, the address decoder 220 is caused to map the (pre-configured) write command address to page B 228. Again, this is accomplished because of the status logic 222 causes the map 224 to select path B based on the status maintained by the control circuitry 210 of the memory device 200.

The write-while-read operation can proceed in such a manner that the suspended read operation can resume while, for example, the write operation is erasing physical bank1 227. Then, after physical bank1 227 is erased, the read operation can then again be suspended in order for the writing operation to proceed. Once a portion of or the entire writing operation is complete, the read operation can then resume again.

After "code x" has been read from page A 226 (i.e., after the read operation is complete) and "updated code x" resides on page B 228, the present technology must do some "remapping" so that the next time a request to read "code x" is issued, the "updated code x" is read rather than the older version of "code x." This "remapping" is essentially performed by updating the status, which will cause the next read command to read "code x" to be mapped to page B 228, of the set of pages. In other words, page B 228 is identified by the status as being the most recent page of the set of pages that has been written to. This is described in further detail with reference to FIG. 3.

Figure 3:
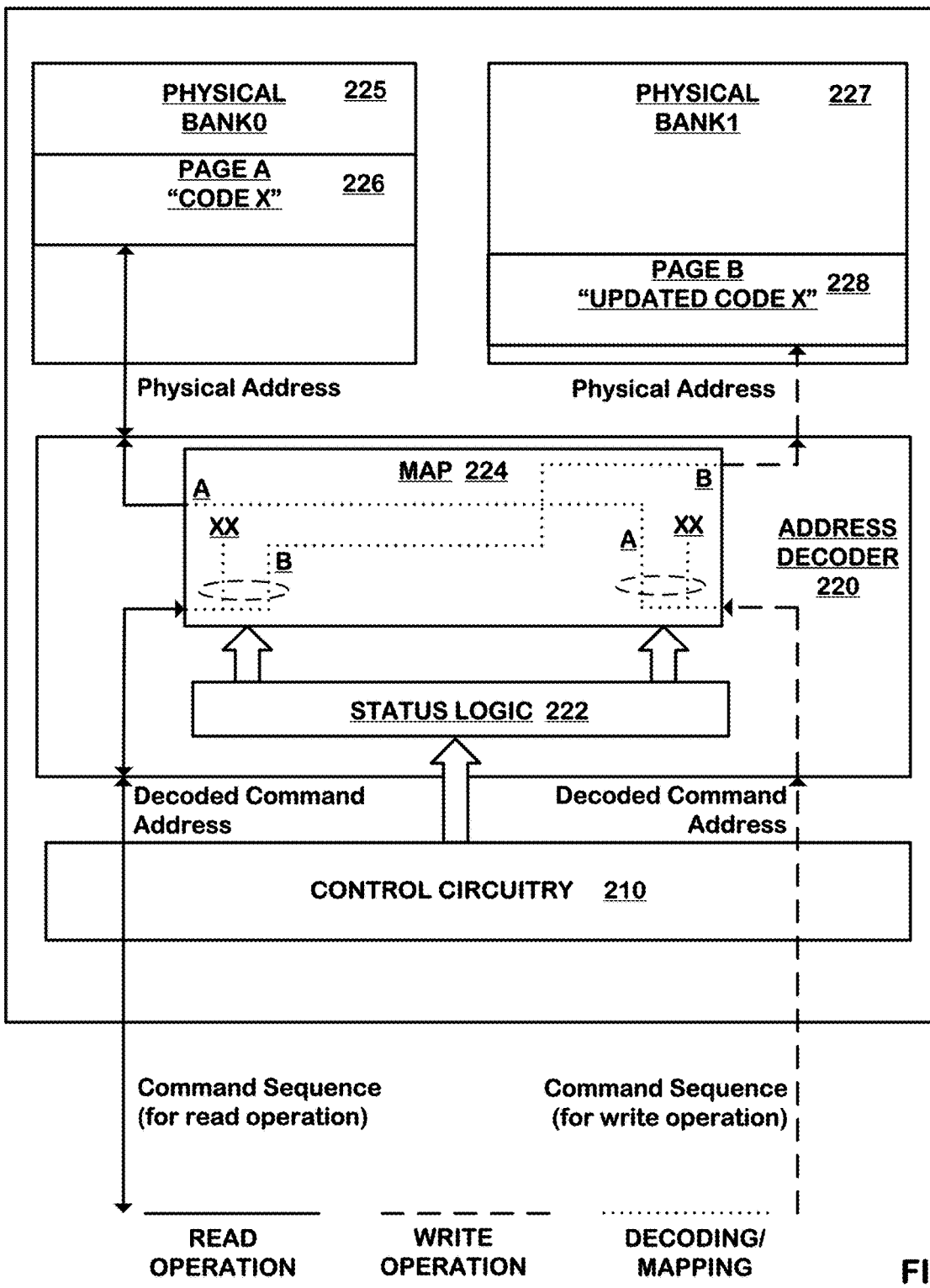
FIG. 3 illustrates a functional block diagram of a remapping operation being performed after the write-while-read operation of FIG. 3 is complete.

FIG. 3 illustrates a functional block diagram of a remapping operation being performed after the write-while-read operation of FIG. 3 is complete. FIG. 3 illustrates the same memory device 200 of FIG. 2. However, FIG. 3 is different from FIG. 2 because the status has been updated by the control circuitry 210, so that the map 224 maps the (pre-configured) read command address to the physical address of page B 228, to which (in FIG. 2) the "updated code x" has been written. Now, the next time a read request to read "code x" is issued, the read operation will be translated to the physical address of physical page B 228. As described above, the control circuitry 210 of the memory device 200 manages the status indicating the most recently written page of the set of pages. However, any other part of the memory device 200 can manage the status. The memory device 200 itself, or the memory controller (not illustrated), or the host (not illustrated) may store a copy of the map 224 and/or a copy of the status indicating which of the pages of the set of pages was most recently written to. These copies can be used to recover from corruption or recent power loss causing the original map 224 and/or status to be compromised.

It has been described that the address decoder 220 (e.g., the map 224 and/or the status logic 222) and/or the status are only updated after both the read and write operations are complete. However, the technology disclosed may update the address decoder 220 and/or the status after the write operation has finished, but while the read operation continues. Additional logic on the memory controller and/or the memory device 200 will be necessary to allow the remapping to be done before the read operation is finished in order allow original "code x" to continue to be read from page B 228 in the implementation illustrated in FIG. 3.

FIG. 3 also illustrates that the control circuitry 210 of the memory device 20 updates the status logic 222 and/or the map 224 to map the (pre-configured) write command address to the other page of the set of pages (i.e., page A 226). Without this additional remapping of the write command address, both the (pre-configured) write command address and the (pre-configured) read command address would be mapped to the physical address of physical page B 228. FIG. 3 illustrates that the (pre-configured) write command address is mapped to the physical address of physical page A 226, because, based on the status, the status logic 222 causes the map 224 to select page A 226. In other words, the status logic 222 causes the map 224 to switch or ping-pong between page A 226 and page B 228 as they are mapped to the (pre-configured) read and write command addresses. This switching or ping-ponging is one way to perform the write-while-read operation, such that the memory device 200 does not need to implement any additional logic once the set of pages (i.e., pages A and B) is determined to correspond to the (pre-configured) command addresses. As mentioned above, the logic required to accomplish this ping-ponging can typically be achieved by implementing the status logic 222 to simply change one bit in an address that allows the map 224 to select which of the physical banks are addressed.

However, the (pre-configured) read and write command addresses do not necessarily need to be mapped according to this ping-pong technique. A different page of the physical bank0 225 and/or a different page of the physical bank1 227 could be used. Additional/different physical banks could be used as well. Also, rather than using two pages, there might be three pages in the set of pages from different banks grouped together, and the write-while-read operation could just continuously rotate through the three pages. In order to accomplish this, the status logic 222 could, for example, use more than one bit to indicate which of the three pages in the set of pages was most recently written to and which of the three pages was most recently ready from. Departure from this ping-pong technique requires additional logic to be executed by the memory device 200.

An example implementation of the write-while-read operation illustrated in FIGS. 2 and 3 is the data that is read and the data that is written (or updated) is dedicated random-access code, such as boot code. Using this structure described, the updated boot code can always be read or accessed using the (pre-configured) read command address and the boot code can always be further updated by performing a write using the (pre-configured) write command address, which will be mapped to a physical page of a different physical block that is being accessed by the read operation. It is possible that the boot code or other data that is the subject to the write-while-read operation occupies more than a single physical page of a physical memory bank. This is not typical of boot code but it is possible, and it is certainly possible with other types of data. However, the write-while-read operation can continue in the same manner if more than one page of physical memory is necessary. For example, subsequent logical addresses can be designated as being only for reading and can be mapped to physical pages in the same manner as discussed above with reference to FIGS. 2 and 3. The same concept applies to the write operation.

The memory device 200 can also manage multiple sets of pages. For example, a second set of pages could occupy physical bank0 225 and physical bank1 227. Using the examples from above, this second set of pages could be used for "code y" and "updated code y." Furthermore, the second set of pages could be from other physical banks, such as physical bank 2 (not illustrated) and physical bank 3 (not illustrated). This technology can implement many more sets of pages and is only limited on the amount of physical memory reserved for such operations. With the additional sets of pages, the control circuitry 210 of the memory device 200 will need to store and maintain a separate status of the most recently written page of each of the sets of pages.

FIG. 4 illustrates example mapping logic of mapping a command address to a physical address of a particular page of a set of pages of a memory. Specifically, FIG. 4 illustrates mapping logic 400 before remapping (e.g., the operation illustrated in FIG. 2) and illustrates mapping logic 410 after the remapping is performed (e.g., the operation illustrated in FIG. 3). Similar to the example discussed with reference to FIG. 2, mapping logic 400 maps the (pre-configured) read command address to the physical address of physical page A because the status indicates that page A is the most recent page, of the set, that has been written to. Mapping logic 400 also maps the (pre-configured) write command address to the physical address of physical page B, because the status indicates that page A is the most recent page, of the set, that has been written to (and that page B, of the set, is not the most recent page that has been written to).

Similar to the example discussed with reference to FIG. 3, mapping logic 410 illustrates that after the remapping process performed, the (pre-configured) read command address is now mapped to the physical address of physical page B, because the status indicates that page B is the most recent page, of the set, that has been written to. Mapping logic 410 also illustrates that the write command address is now mapped to the physical address of physical page A, because the status indicates that page B is the most recent page, of the set, that has been written to (and that page A, of the set, is not the most recent page that has been written to).

In the mapping logic 400 and 410 illustrated in FIG. 4, the solid line illustrates a read operation that points to the (pre-configured) read command address and the dashed line illustrates a write operation that points to the (pre-configured) write command address. Mapping logic 400 illustrates that the read operation utilizes page A (not the grayed out page B) because page A was the most recent page that was written to. Similarly, mapping logic 400 illustrates that the write operation utilizes page B (not the grayed out page A) because page B was not the most recent page that was written to. In contrast, mapping logic 410 illustrates that the read operation utilizes page B (not the grayed out page A) because page B was the most recent page that was written to. Similarly, mapping logic 410 illustrates that the write operation utilizes page A (not the grayed out page B) because page A was not the most recent page that was written to.

While FIG. 4 illustrates high level diagrams, in the sense that actual logical and physical addresses are not included in the mapping logic 400 and 410, it is to be understood by a person of ordinary skill in the art that the proper syntax for referring to specific logical and physical addresses will be required for the mapping logic to be implemented by the memory system that is implementing the write-while-read operations. The specific addressing syntaxes can be dictated by the type of memory system that is being implemented.

Figure 5:
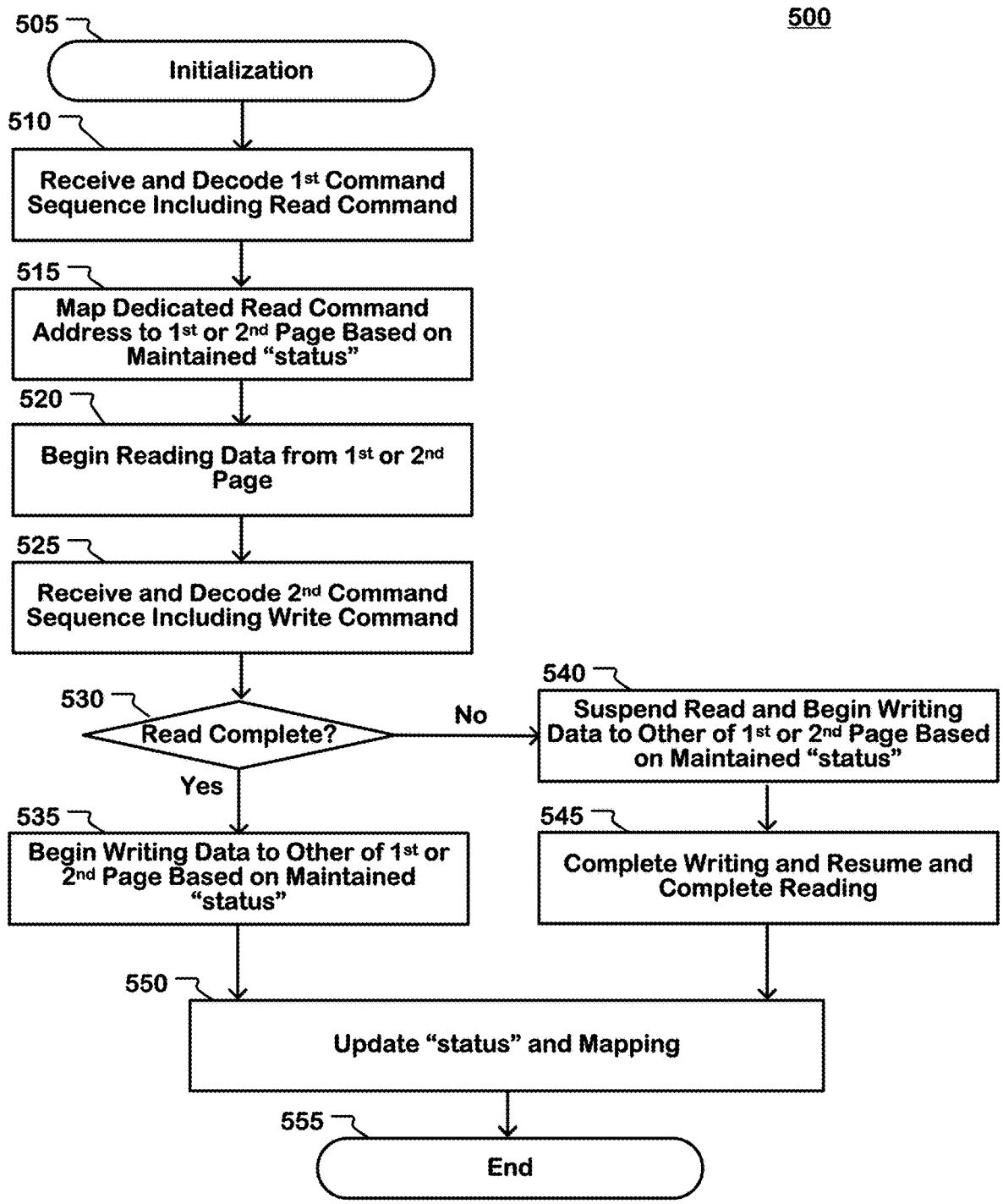
FIG. 5 illustrates a flow chart including the various operations that are performed in order to perform the write-while-read operation.

FIG. 5 illustrates a flow chart including the various operations that are performed in order to perform the write-while-read operation. Specifically, a flow chart 500 of FIG. 5 illustrates the operations performed by the memory device in order to implement the write-while-read operation.

In operation 505 the system is initialized (e.g., setup for reading and writing operations to be performed). For example, in operation 505 the memory is configured with a set or sets of pages. A first set of pages can include a first page in a first bank of the memory and a second page in a second bank of the memory. Further, in operation 505 the control circuitry is configured to maintain the status that indicates the most recently written page of the set of pages. The address decoder is configured to map the command addresses to physical addresses of pages and banks of the memory using a map and status logic. Additionally, command logic of the memory device is configured to decode the command sequences received on a bus interface, where the command sequences include one or more of corresponding operation codes, command addresses and data. The command logic is also configured to enable the control circuitry to execute the operations identified in the received command sequences and to implement the write-while read operation.

Once the system is initialized, in operation 510 a first command sequence is received and decoded. The first command sequence includes a read command and a read command address for reading data from the set of pages.

In operation 515 the address decoder maps a (pre-configured) read command address to one of the first page in the first bank and the second page in the second bank, selected in response to the status. For example, if the first page of the first bank were identified by the status as being the page what was most recently written to (i.e., the page having the most recently updated version of the data), then the first page of the first bank is selected and mapped to the first page in the first bank by the address decoder.

In operation 520 the data is read from the one of the first page and the second page that is mapped to the (pre-configured) read command address.

In operation 525 a second command sequence including a write command (i.e., a write operation) to write data to a (pre-configured) write command address is received. Upon receiving the second command sequence, a determination is made in operation 530 as to whether the reading of the data, as begun in operation 520, has completed. If it is determined in operation 530 the read operation is finished, then a write operation 535 proceeds as normal, meaning that the memory device will not need to suspend the reading operation in order to perform the writing operation. In other words, the memory device will not need to perform a write-while-read operation. However, the write operation to write the data to the (pre-configured) write command address is still performed using to the maintained status and mapping of the address decoder.

If a determination is made in operation 530 that the reading of the data is not complete, then in operation 540 the reading operation will be suspended and the writing operation will begin. Just as in operation 535, the data will be written to the other of the first and second pages, based on the maintained status. Specifically, the address decoder is caused to map the (pre-configured) write command address included in the second command sequence to one of the first page in the first bank and the second page in the second bank, selected in response to the status. For example, if the first page were the page that was being read from, then the second page would be selected and mapped to the (pre-configured) write command address because of the page indicated by the status.

As mentioned above, in order to allow a writing operation to proceed, in operation 540 the read operation is suspended and the data is written to the one of the first page and the second page that is mapped to the (pre-configured) write command address by the address decoder map. The writing operation can have many stages, such as erasing the memory bank, loading a write buffer, etc. The reading can resume (from suspension) while the memory device is performing some of these stages or between some of these stages. For example, while the memory bank is being erased the reading can resume in operation 545. Then after the erasing stage is complete, the writing operation will continue and the reading operation will be suspended again. Accordingly, operations 540 and 545 may can iterate several times until both the reading and the writing are fully complete.

As discussed in this disclosure, a feature of this technology is that the reading is not restarted from the beginning. Rather, it is resumed from where it left off. This can be achieved because the page that was being read from is from a different physical bank than the page that was being written to.

After the writing is completed in operation 535 and also after the reading is completed in operation 545, operation 550 is performed. In operation 550 the status is updated to reflect the most recently written page of the first and second pages and the address decoder and/or the updated to operate accordingly. In operation 555 the procedure ends.

These operations illustrated in flow chart 500 are merely examples of implementing the technology disclosed. These operations can be performed in different orders and some of these operations may not be necessary and/or may be replaced by other operations described in this document.

Figure 6:
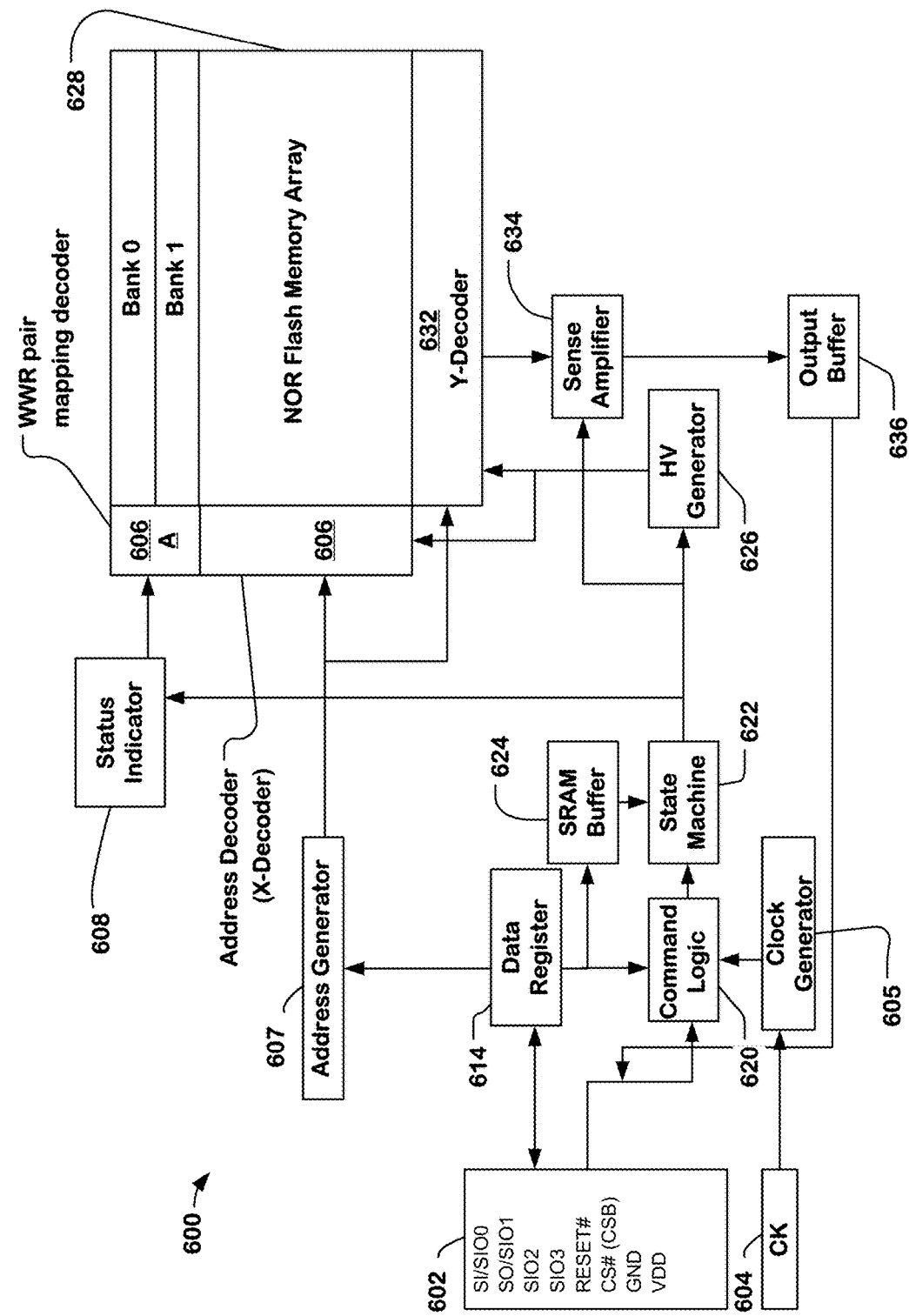
FIG. 6 is a simplified block diagram of an integrated circuit, for example, a NOR flash memory device, including command logic and control circuits supporting a write-while-read operation and related operations as described herein.

FIG. 6 is a simplified block diagram of an integrated circuit 600, for example, a NOR flash memory device, including command logic and control circuits supporting the write-while-read and related operations as described herein. The integrated circuit 600 can be implemented on a single chip. For example, some or all of the components (and the operations performed thereby) of the memory device 200 of FIGS. 2 and 3 can be included in the integrated circuit 600. Alternatively, some of the components (and the operations performed thereby) of the memory controller 120 of FIG. 1 can be included in the integrated circuit 600.

I/O block 602 shows a synchronous serial interface compliant with a serial peripheral interface SPI standard, and having standard pins. CS# is chip select, which can correspond to the CSB line discussed above. When CS# is brought low the device is selected. The RESET# signal allows the device to be reset, terminating the currently running process and resetting the state machine. GND and VDD are ground and power supply, respectively. In standard SPI, SI and SO are serial data input and output, respectively. In Dual SPI operation, SI and SO become bidirectional I/O pins: SIO0 and SIO1. In Quad SPI operation, SIO2 and SIO3 are available for higher-speed transfer. This is an example only; many pin configurations are possible. Serial clock SLCK 604 (or just CK 604) is also provided. A clock generator 605 on the integrated circuit generates clock signals for the command logic 620 and other elements of the integrated circuit. In this embodiment the clock generator 605 receives the SCLK from the SLCK 604 pin. The bus interface represented by I/O block 602 can support double data rate (DDR) or single data rate (SDR) protocols.

Other types of serial interfaces can be used in various embodiments. Memory technologies other than NOR flash memory may be used.

A control signal used to indicate the beginning and ending of a command sequence described herein may be signals on one or more of the bus lines in the block 602 in some examples. For example, in some embodiments, CS# or RESET# may be toggled, such as being pulled low-to-high in a first transition or high-to-low in a second transition. Alternatively, or in addition, a termination event may be generated internally by the chip control logic.

Status indicator 608 includes circuitry and logic configured to maintain a status indicating a most recently written page of dedicated sets of pages of the NOR flash memory array 628. For example, the NOR flash memory array 628 can be configured with sets of pages, such as a first set of pages including a first page in a first bank and a second page in a second bank. Additional sets of pages can also be configured. For this example only a first set of pages will be discussed. This structure regarding the sets of pages and the status has been described in detail with reference to FIGS. 1-4.

The status indicator 608 can contain logic that is able to indicate which pages, of the sets of pages of the NOR flash memory array 628, have been most recently written to. For example, the status maintained by the status indicator 608 can indicate a most recently written page of the first set of pages. If there are additional sets of pages, as mentioned above, the status indicator 608 will also keep track of which pages of the other sets of pages have been most recently written to. The status indicator 608 can obtain these physical addresses of the most recently written pages from the address generator 606 or from other components of the integrated circuit 600. As discussed with reference to FIGS. 2 and 3, functions of the status logic 222 can be implemented by the status indicator 608.

A write-while-read (WWR) set mapping decoder 606A performs the operations of, for example, the address decoder 220 including the map 224 and the status logic 222, as described with reference to FIGS. 2 and 3. Specifically, the WWR set mapping decoder 606A implements logic based on the status provided by the status indicator 608 and maps pre-configured command addresses to physical addresses of pages and banks of the physical memory, such as the NOR flash memory array 628, accordingly. The WWR set mapping decoder 606A can map the (pre-configured) read command addresses and the (pre-configured) write command addresses to the physical addresses of pages and banks of the physical memory based on a map, such as the map 224 of FIGS. 2 and 3, and based logic, such as the status logic 222 of FIGS. 2 and 3. The banks (bank 0 and bank 1) of the NOR flash memory array 628 can be mapped by the logic of the WWR set mapping decoder 606A by simply changing a bit in the address. For example, to enable writing to a page of bank 1 rather than a page of bank 0, the decoder 606A can change one bit of the page address. Based on a command sequence received from the state machine 622 (or other components of the integrated circuit 600) and the status obtained from the status indicator 608 the WWR set mapping decoder 606A will map the (pre-configured) read command address for reading data from the set of pages of the NOR flash memory array 628 to one of the first page in the first bank and the second page in the second bank. For the read command, the most recently written page of the set of pages will be read from based on the status indicated by the status indicator 608 and the combination of the status logic and the map of the WWR set mapping decoder 606A. This will ensure that the most recent version of the data is read from the appropriate page. Likewise, the WWR set mapping decoder 606A will map the write command address pre-configured for writing the data to one of the first page in the first bank and the second page in the second bank. The (pre-configured) write command will typically be mapped, based on the status obtained from the status indicator 608, to the page of the set of pages that has not most recently been written from.

The WWR set mapping decoder 606A, combined with other circuitry and logic of the integrated circuit 600, performs the write-while-read operations described with reference to FIGS. 1-5. Some redundant descriptions thereof are omitted. However, it is noted that the status indicator 608 is continuously updated based on which page, of a particular set of pages, has been most recently written to. By continuously updating the status indicator 608, the integrated circuit 600 is able to ping-pong the reading and the writing from and to the appropriate pages of the sets of pages. As mentioned above, depending upon the implementation this can be done by simply changing a bit of the bank address that is being accessed. This mechanism allows the most recently written data (from the set of pages) to always be read and further allows data to be written to another page of the set of pages without the need to stop and then restart the read operation.

Address generator 606 includes circuits to provide the physical address sequences for access to the NOR flash memory array 628.

Data register 614 can act as an input buffer to store portions of command sequences in some embodiments. Data and parameters may be stored in SRAM buffer 624 in support of interruptible write operations, and other operations. In some examples, the data register 614 may be part of the SRAM buffer 624.

Integrated circuit 600 also includes command logic 620, which may generate internal control signals, and control circuitry such as a state machine 622 with supporting bias circuits. High-voltage generator 626 generates any higher voltages required, for example for read, program, and erase operations. The command logic 620 executes command procedures indicating read, write, erase and data associated therewith. The control circuitry including the state machine 622, in this example, executes embedded program, erase and read operations which access the memory array 628 when enabled by the command logic.

Memory array 628 includes, in addition to the WWR set mapping decoder 606A, X-decoder 606B and Y-decoder 632, and data signals are output via sense amplifier 634. Output buffer 636 may hold output data for output from the device.

In the example shown in FIG. 6, a command sequence comprises a sequence of bytes received on the SIO pins in the I/O block 602. The command logic 620 can include logic to decode the operation code, route the start address to the address counter, and provide control signals to set up and initiate embedded processes identified in the command sequences, including write (e.g. program and erase) and read processes using the state machine 622. The example shown in FIG. 6 is a serial flash device using a serial bus interface for sequential data access. The serial bus interface includes at least one synchronous clock signal CK, data signals, where the width of the storage unit carrying the data is greater than or equal to one bit, and at least one chip select signal CSB. Using a serial bus interface, the command sequences described above can be supported.

This configuration can be used to support buses compliant with the serial peripheral interface SPI standard bus architecture, where the port CS corresponds with the SPI active low chip select CSB, the port CK corresponds with the SPI serial clock SCLK; the port 0 corresponds with the SPI master-out/slave-in MOSI port, the port 1 corresponds with the SPI first master-in/slave-out MISO1 port; the port 2 corresponds with the SPI second master-in/slave-out MISO2 port; and the port 8 corresponds with the SPI third master-in/slave-out MISO3 port. The technology described herein can be used with other standard and non-standard bus architectures, including for example I2C.

Those skilled in the art will appreciate that this diagram is provided for example of one embodiment only; a device supporting interruptible write command sequences as described herein may vary widely from this diagram, comprising different elements, connected in different ways.

The embodiment shown in FIG. 6 includes a NOR flash memory array. Other types of memory systems can be utilized as well, including nonvolatile memory types including phase change memory PCM, resistive memory element memory known as ReRAM or RRAM, NAND flash memory, magnetoresistive memory, and so on. Also, other types of memory systems can be utilized that may include volatile memory such as DRAM.

A number of flowcharts illustrating logic executed by a memory controller or by memory device are described herein. The logic can be implemented using processors programmed using computer programs stored in memory accessible to the computer systems and executable by the processors, by dedicated logic hardware, including field programmable integrated circuits, state machines implemented in circuitry and by combinations of dedicated logic hardware and computer programs. With all flowcharts herein, it will be appreciated that many of the steps can be combined, performed in parallel, or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a memory configured with pages, the pages including a first set of pages including a first page in a first bank and a second page in a second bank;
an address decoder that maps received command addresses to physical addresses of pages and banks of the memory; and
control circuitry configured to maintain a status indicating a most recently written page of the first set of pages, to decode received command sequences that comprise the command addresses, to execute operations identified in the command sequences, and to implement an operation including:
responsive to receiving a first command sequence including a read command address that is pre-configured for reading data from the first set of pages, (i) selecting one of the first page in the first bank and the second page in the second bank in response to the maintained status and (ii) causing the address decoder to map the read command address to the selected one of the first page in the first bank and the second page in the second bank; and
responsive to receiving a second command sequence including a write command address that is pre-configured for writing to the first set of pages, (i) selecting one of the first page in the first bank and the second page in the second bank in response to the maintained status and (ii) causing the address decoder to map the write command address to the selected one of the first page in the first bank and the second page in the second bank.

2. The memory device of claim 1, wherein the operation further includes:
responsive to receiving the first command sequence, reading the data from the one of the first page and the second page, of the first set of pages, selected in response to the status; and
responsive to receiving the second command sequence during the reading of the data, writing data to the one of the first page and the second page, of the first set of pages, selected in response to the status.

3. The memory device of claim 2, wherein the selected one of the first page and the second page, from which the data is read, is one of the first page and the second page indicated by the status as being the most recently written page.

4. The memory device of claim 3, wherein the selected one of the first page and the second page, to which the data is written, is one of the first page and the second page that is not indicated by the status as being the most recently written page.

5. The memory device of claim 2, wherein the reading of the data includes reading boot code from the one of the first page and the second page selected in response to the status and the writing of the data includes writing boot code to the one of the first page and the second page selected in response to the status.

6. The memory device of claim 2, wherein the operation further includes, after completion of the writing, updating the status to indicate the one of the first page and the second page, to which the data was written, as the most recently written page of the first set of pages.

7. The memory device of claim 2, wherein the operation further includes:
resuming the reading after receiving the second command sequence; and
after completion of the reading and the writing, updating the status to indicate the one of the first page and the second page, to which the data was written, as the most recently written page of the first set of pages.

8. The memory device of claim 2, wherein, when the second command sequence is received before the reading of the data is complete, the operation:
suspends the reading of the data from a selected one of the first set of pages selected for the read;
begins the writing of the data to the other page of the first set of pages; and
prior to completion of the writing of the data, resumes the reading of the data from the selected one of the first set of pages selected for the read.

9. The memory device of claim 2, wherein, when the second command sequence is received before the reading of the data is complete, the operation:
suspends the reading of the data from a selected one of the first set of pages selected for the read;
begins the writing of the data to the other page of the first set of pages; and
after completion of the writing of the data, resumes the reading of the data from the selected one of the first set of pages selected for the read.

10. The memory device of claim 1,
wherein the pages include a second set of pages, the second set of pages including a third page in a third bank and a fourth page in a fourth bank, and
wherein the maintained status further indicates a most recently written page of the second set of pages.

11. The memory device of claim 10, wherein the operation further includes:
responsive to receiving a third command sequence, reading the data from the one of the third page and the fourth page, of the second set of pages, selected in response to the status; and
responsive to receiving a fourth command sequence, writing data from the one of the third page and the fourth page, of the second set of pages, selected in response to the status.

12. The memory device of claim 1,
wherein the pages include a second set of pages, the second set of pages including a third page in the first bank and a fourth page in the second bank, and
wherein maintained status further indicates a most recently written page of the second set of pages.

13. The memory device of claim 12, wherein the operation further includes:
responsive to receiving a third command sequence, reading the data from the one of the third page and the fourth page, of the second set of pages, selected in response to the status; and
responsive to receiving a fourth command sequence, writing data to the one of the third page and the fourth page, of the second set of pages, selected in response to the status.

14. The memory device of claim 1,
wherein the first set of pages further includes a third page, and wherein the operation further includes:
responsive to receiving the first command sequence, causing the address decoder to map the read command address to one of the first page in the first bank, the second page in the second bank and the third page selected in response to the status; and
responsive to receiving the second command sequence, causing the address decoder to map the write command address to one of the first page in the first bank, the second page in the second bank and the third page selected in response to the status.

15. The memory device of claim 14, wherein the third page is in a third bank of the memory.

16. A method of operating a memory device including a memory having pages and banks, the method comprising:
configuring a first set of pages of the memory to include a first page in a first bank and a second page in a second bank;
mapping received command addresses to physical addresses of the pages and the banks of the memory;
maintaining a status indicating a most recently written page of the first set of pages;
decoding received command sequences that comprise the command addresses;
executing operations identified in the command sequences; and
implementing an operation including:
responsive to receiving a first command sequence including a read command address that is pre-configured for reading data from the first set of pages, (i) selecting one of the first page in the first bank and the second page in the second bank in response to the maintained status and (ii) mapping the read command address to the selected one of the first page in the first bank and the second page in the second bank; and
responsive to receiving a second command sequence including a write command address that is pre-configured for writing to the first set of pages, (i) selecting one of the first page in the first bank and the second page in the second bank in response to the maintained status and (ii) mapping the write command address to the selected one of the first page in the first bank and the second page in the second bank.

17. The method of claim 16, wherein the operation further includes:
responsive to receiving the first command sequence, reading the data from the one of the first page and the second page, of the first set of pages, selected in response to the status; and
responsive to receiving the second command sequence during the reading of the data, writing data to the one of the first page and the second page, of the first set of pages, selected in response to the status.

18. The method of claim 17, wherein the selected one of the first page and the second page, from which the data is read, is one of the first page and the second page indicated by the status as being the most recently written page.

19. The method of claim 17, wherein the operation further includes, after completion of the writing, updating the status to indicate the one of the first page and the second page, to which the data was written, as the most recently written page of the first set of pages.

20. A method of manufacturing a memory device including:

providing a memory configured with pages, the pages including a first set of pages including a first page in a first bank and a second page in a second bank;

providing and configuring an address decoder to map received command addresses to physical addresses of pages and banks of the memory; and providing control circuitry configured to maintain a status indicating a most recently written page of the first set of pages, to decode received command sequences that comprise the command addresses, to execute operations identified in the command sequences, and to implement an operation including:

responsive to receiving a first command sequence including a read command address that is pre-configured for reading data from the first set of pages, (i) selecting one of the first page in the first bank and the second page in the second bank in response to the maintained status and (ii) causing the address decoder to map the read command address to the selected one of the first page in the first bank and the second page in the second bank; and responsive to receiving a second command sequence including a write command address that is pre-configured for writing to the first set of pages, (i) selecting one of the first page in the first bank and the second page in the second bank in response to the maintained status and (ii) causing the address decoder to map the write command address to the selected one of the first page in the first bank and the second page in the second bank.

* * * * *